(12) United States Patent
Reams

(10) Patent No.: US 9,875,756 B2
(45) Date of Patent: Jan. 23, 2018

(54) SYSTEM AND METHOD FOR ARTIFACT MASKING

(71) Applicant: Psyx Research, Inc., Irvine, CA (US)

(72) Inventor: Robert W. Reams, Bellevue, WA (US)

(73) Assignee: PSYX RESEARCH, INC., Irvine, CA (US)

( * ) Notice: Subject to any disclaimer, the term of this patent is extended or adjusted under 35 U.S.C. 154(b) by 0 days.

(21) Appl. No.: 14/863,365

(22) Filed: Sep. 23, 2015

(65) Prior Publication Data

US 2016/0171968 A1    Jun. 16, 2016

Related U.S. Application Data

(60) Provisional application No. 62/092,603, filed on Dec. 16, 2014, provisional application No. 62/133,167, (Continued)

(51) Int. Cl.

| G10L 21/034 | (2013.01) |
| H04S 3/02 | (2006.01) |
| G10L 19/02 | (2013.01) |
| G10L 21/02 | (2013.01) |
| H04N 5/52 | (2006.01) |

(Continued)

(52) U.S. Cl.
CPC ........... G10L 21/034 (2013.01); G10L 19/02 (2013.01); G10L 19/028 (2013.01); G10L 21/02 (2013.01); G10L 21/0205 (2013.01); G10L 25/06 (2013.01); H04N 5/52 (2013.01); H04N 5/60 (2013.01); H04N 21/439 (2013.01); H04R 3/00 (2013.01); H04R 25/356 (2013.01); H04R 25/505 (2013.01); H04S 3/02 (2013.01); H03G 5/165 (2013.01); H04R 3/14 (2013.01); H04R 2225/43 (2013.01); H04R 2420/01 (2013.01)

(58) Field of Classification Search
CPC ..... G10L 21/034; G10L 19/008; H04S 3/004; H04B 1/1018
USPC ....... 381/3, 14, 18, 73.1, 97, 107, 1, 17, 98, 381/111, 314; 700/94; 704/205, 212; 375/340; 455/452.2
See application file for complete search history.

(56) References Cited

U.S. PATENT DOCUMENTS 4,243,840 A * 1/1981 Kates ................... H04R 3/14
381/99
6,961,432 B1 * 11/2005 Sinha ................... H04H 20/22
370/465

(Continued)

FOREIGN PATENT DOCUMENTS

WO    2010/003556 A1    1/2010

OTHER PUBLICATIONS

The Invitation to pay additional fees and, where applicable, protest fee issued by EPO dated Mar. 23, 2016 for International patent application No. PCT/US2015/065936.

(Continued)

*Primary Examiner* — Gerald Gauthier
(74) *Attorney, Agent, or Firm* — Jackson Walker LLP; Christopher J. Rourk; Thomas B. Hayes

(57) ABSTRACT

A system for processing audio data comprising a first signal processing path configured to generate a mask control signal. A second signal processing path configured to generate a decorrelated input audio signal. A mixer configured to mix the mask control signal and the decorrelated input audio signal and to generate an output.

18 Claims, 2 Drawing Sheets

Related U.S. Application Data filed on Mar. 13, 2015, provisional application No. 62/156,061, filed on May 1, 2015, provisional application No. 62/156,065, filed on May 1, 2015.

(51) Int. Cl.

| | | |
|---|---|---|
| *H04N 5/60* | (2006.01) | |
| *H04N 21/439* | (2011.01) | |
| *G10L 25/06* | (2013.01) | |
| *H04R 3/00* | (2006.01) | |
| *H04R 25/00* | (2006.01) | |
| *G10L 19/028* | (2013.01) | |
| *H04R 3/14* | (2006.01) | |
| *H03G 5/16* | (2006.01) | |

(56) References Cited

U.S. PATENT DOCUMENTS

| | | | |
|---|---|---|---|
| 9,161,148 B2* | 10/2015 | Lee | H04S 3/004 |
| 2003/0233234 A1 | 12/2003 | Truman et al. | |
| 2004/0098149 A1* | 5/2004 | Liu | H03G 5/005 |
| | | | 700/94 |
| 2004/0102963 A1* | 5/2004 | Li | G10L 19/0212 |
| | | | 704/205 |
| 2004/0122540 A1* | 6/2004 | Allred | H03H 17/0294 |
| | | | 700/94 |
| 2005/0094828 A1* | 5/2005 | Sugimoto | H03G 9/06 |
| | | | 381/98 |
| 2006/0217975 A1 | 9/2006 | Sung et al. | |
| 2007/0038439 A1* | 2/2007 | Schuijers | G10L 19/00 |
| | | | 704/212 |
| 2008/0226085 A1* | 9/2008 | Takashima | H04S 5/00 |
| | | | 381/18 |
| 2009/0092259 A1* | 4/2009 | Jot | G10L 19/008 |
| | | | 381/17 |
| 2009/0198356 A1* | 8/2009 | Goodwin | G10L 19/008 |
| | | | 700/94 |
| 2009/0220109 A1* | 9/2009 | Crockett | H03G 3/3089 |
| | | | 381/107 |
| 2009/0279706 A1* | 11/2009 | Takashima | H04S 3/008 |
| | | | 381/17 |
| 2010/0086149 A1* | 4/2010 | Kuroda | H03G 7/002 |
| | | | 381/103 |
| 2011/0300874 A1* | 12/2011 | Chen | H04B 15/04 |
| | | | 455/452.2 |
| 2011/0317841 A1* | 12/2011 | Trammell | H03G 5/165 |
| | | | 381/18 |
| 2012/0076305 A1* | 3/2012 | Virolainen | H04M 3/568 |
| | | | 381/17 |
| 2012/0076324 A1* | 3/2012 | Griffiths | H03G 5/005 |
| | | | 381/98 |
| 2012/0128159 A1* | 5/2012 | McGrath | H04S 1/002 |
| | | | 381/17 |
| 2012/0230495 A1* | 9/2012 | Murali | H04H 40/45 |
| | | | 381/3 |
| 2012/0257694 A1* | 10/2012 | Balakrishnan | H04B 1/1646 |
| | | | 375/340 |
| 2013/0077795 A1* | 3/2013 | Risbo | H04R 29/003 |
| | | | 381/55 |
| 2013/0129117 A1* | 5/2013 | Thomsen | H04R 3/00 |
| | | | 381/111 |
| 2013/0243227 A1* | 9/2013 | Kinsbergen | H04M 1/2475 |
| | | | 381/314 |
| 2014/0185811 A1* | 7/2014 | Stein | H04S 7/307 |
| | | | 381/17 |
| 2014/0226822 A1* | 8/2014 | Engdegard | G10L 25/69 |
| | | | 381/3 |
| 2014/0254827 A1* | 9/2014 | Bailey | H04R 3/04 |
| | | | 381/98 |
| 2016/0171968 A1* | 6/2016 | Reams | G10L 19/028 |
| | | | 381/73.1 |
| 2016/0173979 A1* | 6/2016 | Reams | G10L 19/028 |
| | | | 381/97 |
| 2016/0173995 A1* | 6/2016 | Reams | G10L 19/028 |
| | | | 381/107 |
| 2016/0232900 A1* | 8/2016 | Villemoes | G10L 19/008 |
| 2017/0149461 A1* | 5/2017 | Han | H04B 1/1018 |

OTHER PUBLICATIONS

Anonymous, "Dynamic range compression, Wikipedia, the free encyclopedia", 2003.

Anonymous, "Noise gates—Dynamics processors—Pro-Audio Basics", 2014.

The International Search report and Written Opinion issued by EPO dated May 31, 2016 for International patent application No. PCT/US2015/065936.

Ritchie, "MediaRenderer:1 Device Template Version 1.01", UPnP™ Forum, Jun. 25, 2002, pp. 1-12.

Ritchie, "MediaServer:1 Device Template Version 1.01", UPnP™ Forum, Jun. 25, 2002, pp. 1-12.

Kou et al., "RenderingControl:1 Service Template Version 1.01", UPnP™ Forum, Jun. 25, 2002, pp. 1-63.

Lawrence, "Basic:1.0 Device efinition Version 1.0", UPnP™ Forum, Dec. 12, 2002, pp. 1-7.

Stickler et al., "HVAC_System:1 Device Template", UPnP™ Forum, May 13, 2003, pp. 1-8.

"Universal Plug and Play Device Architecture", Jun. 8, 2000, ver. 1.0, pp. 1-54.

Miller et al., "UPnP Forum AV:4 Overview", UPnP™ Forum, 2012, pp. 1-45.

Ritchie et al., "UPnP AV Architecture:1", UPnP™ Forum, Jun. 25, 2002, pp. 1-22.

Buerl et al., "AVTransport:1 Service Template Version 1.01", UPnP™ Forum, Jun. 25, 2002, pp. 1-67.

Chan et al., "ConnectionManager:1 Service Template Version 1.01", UPnP™ Forum, Jun. 25, 2002, pp. 1-25.

Debique et al., "ContentDirectory:1 Service Template Version 1.01", UPnP™ Forum, Jun. 25, 2002, pp. 1-89.

The International Preliminary Report on Patentability issued by the International Bureau of WIPO dated Jun. 29, 2017 for International patent application No. PCT/US2015/065936.

* cited by examiner

SYSTEM AND METHOD FOR ARTIFACT MASKING

RELATED APPLICATIONS

The present application claims priority to and benefit of U.S. Provisional Patent Application No. 62/092,603, filed on Dec. 16, 2014, U.S. Provisional Patent Application No. 62/133,167, filed on Mar. 13, 2015, U.S. Provisional Patent Application No. 62/156,061, filed on May 1, 2015, and U.S. Provisional Patent Application No. 62/156,065, filed on May 1, 2015, each of which are hereby incorporated by reference for all purposes as if set forth herein in their entirety.

TECHNICAL FIELD

The present disclosure relates generally to audio data processing, and more specifically to a system and method for masking artifacts in highly compressed audio.

BACKGROUND OF THE INVENTION

In highly-compressed audio data, the resulting sound can include a number of sound artifacts that detract from the quality of the audio data.

SUMMARY OF THE INVENTION

A system for processing audio data is provided that includes a first signal processing path that generates a mask control signal, which has a large value when audio artifacts are present and a small value when audio artifacts are not present. A second signal processing path generates a decorrelated input audio signal, and a mixer mixes the mask control signal and the decorrelated input audio signal to generate an output.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE SEVERAL VIEWS OF THE DRAWINGS

Aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views, and in which.

DETAILED DESCRIPTION OF THE INVENTION

Figure 1:
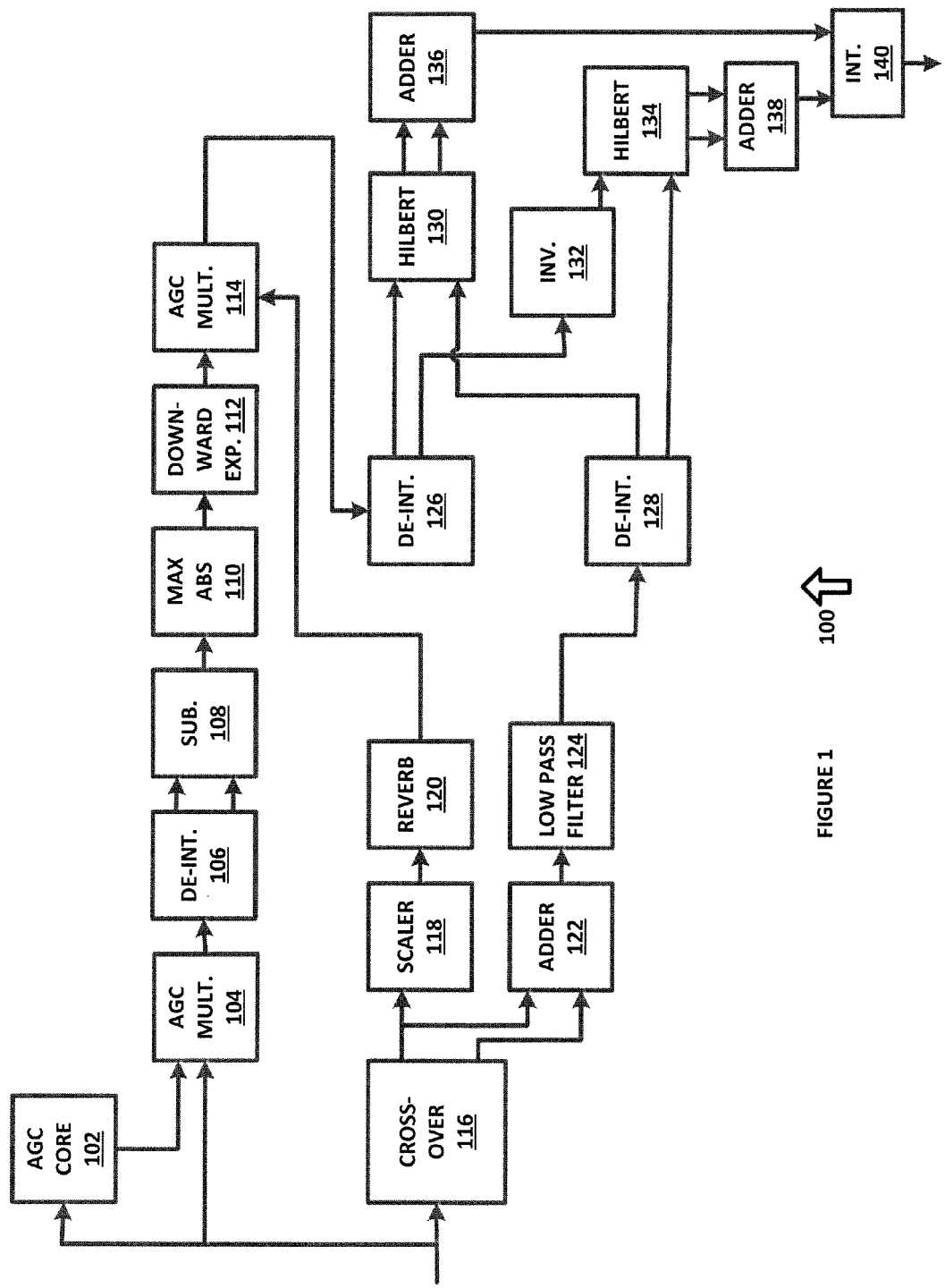
FIG. 1 is a diagram of a system for providing artifact masking of audio data artifacts in accordance with an exemplary embodiment of the present disclosure.

In the description that follows, like parts are marked throughout the specification and drawings with the same reference numerals. The drawing figures might not be to scale and certain components can be shown in generalized or schematic form and identified by commercial designations in the interest of clarity and conciseness.

FIG. 1 is a diagram of a system 100 for providing artifact masking of audio data artifacts in accordance with an exemplary embodiment of the present disclosure. System 100 can be implemented in hardware or a suitable combination of hardware and software, and can be one or more software systems operating on a special purpose audio processor or other suitable devices.

As used herein, "hardware" can include a combination of discrete components, an integrated circuit, an application-specific integrated circuit, a field programmable gate array, or other suitable hardware. As used herein, "software" can include one or more objects, agents, threads, lines of code, subroutines, separate software applications, two or more lines of code or other suitable software structures operating in two or more software applications, on one or more processors (where a processor includes a microcomputer or other suitable controller, memory devices, input-output devices, displays, data input devices such as a keyboard or a mouse, peripherals such as printers and speakers, associated drivers, control cards, power sources, network devices, docking station devices, or other suitable devices operating under control of software systems in conjunction with the processor or other devices), or other suitable software structures. In one exemplary embodiment, software can include one or more lines of code or other suitable software structures operating in a general purpose software application, such as an operating system, and one or more lines of code or other suitable software structures operating in a specific purpose software application. As used herein, the term "couple" and its cognate terms, such as "couples" and "coupled," can include a physical connection (such as a copper conductor), a virtual connection (such as through randomly assigned memory locations of a data memory device), a logical connection (such as through logical gates of a semiconducting device), other suitable connections, or a suitable combination of such connections.

System 100 includes AGC core 102, which provides automatic gain control of input audio data, which can be digital audio data in the time domain or other suitable audio data. AGC core 102 provides averaged input audio data over a 200 millisecond period or other suitable periods. The output of AGC core 102 is provided to AGC multiplier 104 with the input audio data, and which normalizes the input audio data. The output of AGC multiplier 104 is then provided to de-interleaver 106, which can separate the audio data into left and right channels or other suitable numbers of channels, if multiple channels are present. Subtracter 108 subtracts the left channel from the right channel and maximum absolute value detector 110 generates an output for downward expander 112. The output of maximum absolute value detector 110 provides an indication of the level of audio artifacts in the audio data, as highly compressed audio with a large number of audio artifacts will also have a large value of L−R.

Downward expander 112 can have a very short attack time such as 0.01 milliseconds or less, and a decay time that ranges from 10 to 80 milliseconds, such as 30 milliseconds. This signal is provided to AGC multiplier 114 with the low frequency signal components from reverb 120 (discussed below). The output of AGC multiplier 114 is the relative magnitude of the envelope of the L−R to L+R ratio. When a "wide" signal is being processed, which is one where the value of L−R is greater than the value of L+R, then downward expander 112 has a gain of zero, so that when the ratio of L−R to L+R is 1 (which is representative of a normal stereo signal), AGC multiplier 114 is provided with a control signal that turns it all the way on. This configuration results in a maximum injection of scaled, decorrelated low pass stereo. Thus, where the L−R component is large, which usually results in the generation of more audio artifacts, the maximum amount of auxiliary masker signals will be injected into the L−R signal.

More audio artifacts are typically generated with a large L−R value, such as when the number of bits of audio data that still need to be encoded as the encoder approaches the end of a frame, the codec looks for ways to save the number of bits that need to be encoded. In this case, some frequency lines might get set to zero (deleted), typically high frequency content. Furthermore, when the loss of bandwidth changes from frame to frame, the generation of artifacts can become more noticeable. For example, encoders can switch between mid/side stereo coding and intensity stereo coding for lower bit-rates, but switching between modes can result in the generation of audio artifacts.

The output of AGC multiplier 114 is provided to de-interleaver 126, which separates the signal into left and right channel components. The left channel component is provided to Hilbert transform 130, and the right channel component is inverted by inverter 132 and is provided to Hilbert transform 134.

The input audio data is also provided to crossover filter 116 which generates a low frequency component that is provided to scaler 118 and adder 122, and a high frequency component that is also added to adder 122. The use of crossover 116 and adder 122 generates audio data having the same phase as the low pass filter by itself, and helps to synchronize the processed L−R audio and the unprocessed L−R audio. The sum has a flat magnitude response, where the phase is at 90 or 270 shift relative to crossover 116. Low pass filter 124 removes high frequency components and the resulting signal is provided to de-interleaver 128, which generates a left channel output to Hilbert transform 130 and a right channel output to Hilbert transform 134.

The low frequency output from crossover filter 116 is provided to scaler 118, which scales the low frequency output and provides the low frequency output to reverb 120, which can utilize a variable time delay unit such as that disclosed in co-pending application Ser. No. 14/863,376, entitled, "System and Method for Decorrelating Audio Data," which is commonly owned with this application and which is hereby incorporated by reference for all purposes as if set forth herein in its entirety. The decorrelated low frequency audio data mixes with the output of downward expander 112, as discussed. The left channel components provided to Hilbert filter 130 are added by adder 136, and the right channel frequency components provided to Hilbert filter 134 are added by adder 138. The outputs of adders 136 and 138 are then provided to interleaver 140 to generate an output audio signal. Hilbert filter 130 receives the low pass, decorrelated multiplied version of L−R at a 90 degree-shifted input, and unprocessed L−R audio at 0 degrees, which sums the negative components and will not cause the audio image to shift to the left. Hilbert filter 134 generates synthetic artifact masking by moving the artifacts to the back of the image, where other artifacts are, and not in the front stereo image, where the audio artifacts will be more readily apparent.

In operation, system 100 eliminates audio artifacts that are generated when audio data that has a large L−R to L+R ratio is being processed, by generating masking signals that cause the audio artifacts to be relocated out of the front stereo audio and moved into the surround stereo audio.

Figure 2:
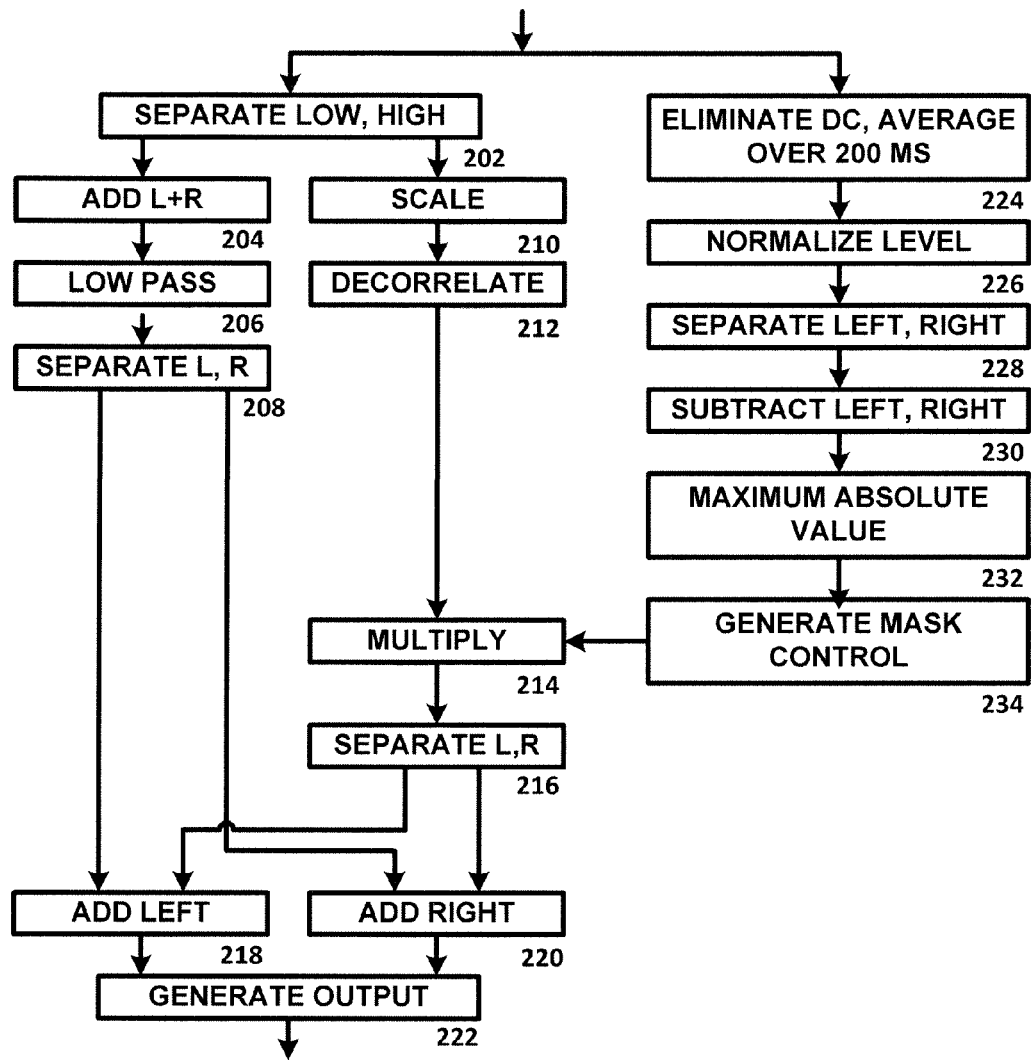
FIG. 2 is a diagram of an algorithm for processing audio data to mask artifacts in accordance with an exemplary embodiment of the present disclosure.

FIG. 2 is a diagram of an algorithm 200 for processing audio data in accordance with an exemplary embodiment of the present disclosure. Algorithm 200 can be implemented in hardware or a suitable combination of hardware and software, and can be one or more software systems operating on a special purpose audio processor.

Algorithm 200 begins at 202 and 234 in parallel. At 202, input audio data is separated into low and high frequency components, and then proceeds in parallel to 204 and 210. At 204, the low and high frequency components are added back together, and at 206, the combined low and high frequency components are processed with a low pass filter. The left and right channel components of the audio data are then separated.

At 210, the low frequency components are scaled and are then decorrelated at 212, such as by processing through a reverb processor or in other suitable manners.

At 224, the input audio is processed to remove DC components of the audio data and to average the audio data over 200 millisecond periods. The algorithm then proceeds to 226 where the level is normalized, and then the left and right channels are separated at 228, such as with a de-interleaver or in other suitable manners. At 230, the difference between the left and right channel audio data is determined, such as by subtraction or in other suitable manners, and the algorithm proceeds to 232 where the maximum absolute value of the difference signal is determined. The algorithm then proceeds to 234 where a mask control signal is generated, such as by using a downward expander or in other suitable manners. The mask control signal is then multiplied at 214 with the decorrelated low frequency audio signal components, and is separated into left and right channel signals at 216.

At 218, the left channel components from 208 and 216 are added, either directly or after other suitable processing, such as inversion, and at 220, the right channel components from 208 and 216 are added, either directly or after other suitable processing, such as inversion. The combined left and right audio channel inputs are then used to generate an audio output signal having improved masking of audio artifacts.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

What is claimed is:

1. A system for processing audio data comprising:
a first signal processing path configured to generate a mask control signal;
a second signal processing path configured to generate a decorrelated input audio signal; and
a mixer configured to mix the mask control signal and the decorrelated input audio signal and to generate an output;
wherein the first signal path comprises a first automatic gain control unit configured to remove DC signal components from an input audio signal; and a second automatic gain control unit coupled to the first automatic gain control unit and configured to normalize a DC compensated input audio signal with the input audio signal.

2. The system of claim 1 wherein the first signal path further comprises a downward expander.

3. The system of claim 1 wherein the first signal path further comprises a de-interleaver.

4. The system of claim 1 wherein the first signal path further comprises a subtractor coupled to a maximum absolute value detector.

5. The system of claim 1 wherein the first signal path further comprises an automatic gain control multiplier coupled to the mixer.

6. The system of claim 1 wherein the second signal processing path further comprises a cross-over filter generating a low frequency output and a high frequency output.

7. The system of claim 6 wherein the second signal processing path further comprises a scaler coupled to the low frequency output.

8. The system of claim 6 wherein the second signal processing path further comprises an adder coupled to the low frequency output and the high frequency output.

9. The system of claim 7 wherein the second signal processing path further comprises a decorrelator coupled to the scaler.

10. A method for processing audio data comprising:
generating a mask control signal using a first signal processing path;
generating a decorrelated input audio signal using a second signal processing path; and
mixing the mask control signal and the decorrelated input audio signal with a mixer to generate an output;
wherein generating the mask control signal using the first signal processing path comprises removing DC signal components from an input audio signal using a first automatic gain control unit to generate a DC compensated input audio signal; and normalizing the DC compensated input audio signal with the input audio signal using a second automatic gain control unit coupled to the first automatic gain control unit.

11. The method of claim 10 wherein generating the mask control signal using the first signal processing path comprises generating a mask control signal using a downward expander having an attack time of 0.01 milliseconds or less.

12. The method of claim 10 wherein generating the mask control signal using the first signal processing path comprises generating the mask control signal using a de-interleaver.

13. The method of claim 10 wherein generating the mask control signal using the first signal processing path comprises generating the mask control signal using a subtractor coupled to a maximum absolute value detector.

14. The method of claim 10 wherein generating the mask control signal using the first signal processing path comprises generating the mask control signal using an automatic gain control multiplier coupled to the mixer.

15. The method of claim 10 wherein generating a decorrelated input audio signal using a second signal processing path comprises generating a decorrelated input audio signal using a cross-over filter generating a low frequency output and a high frequency output.

16. The method of claim 15 wherein the second signal processing path further comprises a scaler coupled to the low frequency output.

17. The method of claim 15 wherein the second signal processing path further comprises an adder coupled to the low frequency output and the high frequency output.

18. In a system for processing audio data having a first signal processing path configured to generate a mask control signal, a second signal processing path configured to generate a decorrelated input audio signal, a mixer configured to mix the mask control signal and the decorrelated input audio signal and to generate an output, wherein the first signal path further comprises a downward expander, a first automatic gain control unit configured to remove DC signal components from an input audio signal, a second automatic gain control unit coupled to the first automatic gain control unit and configured to normalize a DC compensated input audio signal with the input audio signal, a de-interleaver, a subtractor coupled to a maximum absolute value detector, an automatic gain control multiplier coupled to the mixer, a cross-over filter generating a low frequency output and a high frequency output, wherein the second signal processing path further comprises a scaler coupled to the low frequency output, an adder coupled to the low frequency output and the high frequency output, and a decorrelator coupled to the scaler, a method for processing audio data comprising:
generating the mask control signal using the first signal processing path;
generating the decorrelated input audio signal using the second signal processing path;
mixing the mask control signal and the decorrelated input audio signal with the mixer to generate the output;
wherein generating the mask control signal using the first signal processing path comprises:
generating the mask control signal using a downward expander;
removing DC signal components from the input audio signal using a first automatic gain control unit to generate the DC compensated input audio signal;
normalizing the DC compensated input audio signal with the input audio signal using a second automatic gain control unit coupled to the first automatic gain control unit;
generating the mask control signal using a de-interleaver;
generating the mask control signal using a subtractor coupled to a maximum absolute value detector; and
generating the mask control signal using an automatic gain control multiplier coupled to the mixer; and
wherein generating a decorrelated input audio signal using a second signal processing path comprises:
generating a decorrelated input audio signal using a cross-over filter generating a low frequency output and a high frequency output;
wherein the second signal processing path further comprises a scaler coupled to the low frequency output; and
wherein the second signal processing path further comprises an adder coupled to the low frequency output and the high frequency output.

* * * * *